United States Patent
Teraguchi

(10) Patent No.: US 7,973,338 B2
(45) Date of Patent: Jul. 5, 2011

(54) HETERO JUNCTION FIELD EFFECT TRANSISTOR AND METHOD OF FABRICATING THE SAME

(75) Inventor: Nobuaki Teraguchi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 14 days.

(21) Appl. No.: 12/507,604

(22) Filed: Jul. 22, 2009

(65) Prior Publication Data

US 2010/0012924 A1 Jan. 21, 2010

Related U.S. Application Data

(62) Division of application No. 11/806,783, filed on Jun. 4, 2007, now Pat. No. 7,745,852.

(30) Foreign Application Priority Data

Jun. 27, 2006 (JP) ................................. 2006-176347

(51) Int. Cl.
*H01L 29/08* (2006.01)
(52) U.S. Cl. .................... 257/194; 257/20; 257/E29.246
(58) Field of Classification Search ............... 257/12, 257/14, 15, 20, 22
See application file for complete search history.

(56) References Cited

U.S. PATENT DOCUMENTS 6,656,823 B2 * 12/2003 Lee et al. ....................... 438/575

FOREIGN PATENT DOCUMENTS

| JP | 2000-76024 A | 3/2000 |
|----|--------------|--------|
| JP | 2000-243947 A | 9/2000 |
| JP | 2001-284577 A | 10/2001 |
| JP | 2002-76024 A | 3/2002 |
| JP | 2003-45900 A | 2/2003 |
| JP | 2003-445900 A | 2/2003 |
| JP | 2003-197645 A | 7/2003 |

OTHER PUBLICATIONS

Machine translation of JP2002-076024.*
Ken Nakata et al. "Normally Off AlGaN/GaN HEMT with Recessed Gate for High Power Applications," IEICE Technical Report, Oct. 2005, vol. 105, No. 325, pp. 51-56.

* cited by examiner

*Primary Examiner* — Kiesha R Bryant
*Assistant Examiner* — Mark W Tornow
(74) *Attorney, Agent, or Firm* — Birch, Stewart, Kolasch & Birch, LLP

(57) ABSTRACT

There is provided a hetero junction field effect transistor including: a first layer of a nitride based, group III-V compound semiconductor; a second layer of a nitride based, group III-V compound semiconductor containing a rare earth element, overlying the first layer; a pair of third layers of a nitride based, group III-V compound semiconductor, overlying the second layer, the third layers being spaced from each other; a gate electrode disposed between the third layers at least a region of the second layer; and a source electrode overlying one of the third layers and a drain electrode overlying an other of the third layers. A method of fabricating the hetero junction field effect transistor is also provided.

4 Claims, 4 Drawing Sheets

HETERO JUNCTION FIELD EFFECT TRANSISTOR AND METHOD OF FABRICATING THE SAME

This application is a divisional application of U.S. patent application Ser. No. 11/806,783 filed Jun. 4, 2007 now U.S. Pat. No. 7,745,852, claiming priority to Japanese Patent Application No. 2006-176347 filed with the Japan Patent Office on Jun. 27, 2006, the entire contents of all of which are hereby incorporated by reference.

BACKGROUND OF THE INVENTION

1. Field of the Invention

The present invention relates to hetero junction field effect transistors and methods of fabricating the same, and particularly to hetero junction field effect transistors allowing a recessed gate to be formed with good repeatability and methods of fabricating the same.

2. Description of the Background Art

Conventionally a normally off hetero junction field effect transistor utilizing a nitride based, group III-V compound semiconductor represented by a formula of $Al_xGa_yIn_zN$ has been implemented for example by etching a barrier layer of nitride based, group III-V compound semiconductor underlying a gate electrode in plasma to reduce the layer in thickness to form a recessed gate, wherein $0 \leq x \leq 1$, $0 \leq y \leq 1$, $0 \leq z \leq 1$, and $x+y+z \neq 0$ (see "Normally Off AlGaN/GaN HEMT with Recessed Gate for High Power Applications", Ken Nakata, Takeshi Kawasaki, and Seiji Yaegassi, IEICE Technical Report, Vol. 105, No. 325, pp. 51-56, for example).

SUMMARY OF THE INVENTION

However, conventionally etching in plasma, as described above, is disadvantageous in that etching the barrier layer in plasma is done as controlled in time.

More specifically, even if the state of the plasma varies with the current condition of equipment, wafers are etched in the plasma only for a fixed period of time. As a result, the wafers thus processed in the plasma are etched differently in depth and provide barrier layers having their respective thin portions different in thickness.

Furthermore, even a single wafer thus etched also has a depth varying with the state of the plasma, and thus provides a barrier layer having a thin portion varying in thickness.

Thus while forming a recessed gate requires that a barrier layer have a thin portion with a thickness controlled with a precision of a few nm with good repeatability, the conventional method that utilizes etching in plasma provides a single wafer with a barrier layer having a thin portion varying in thickness, and different wafers with barrier layers having thin portions, respectively, different in thickness. This disadvantageously provides recessed gates with variation and hence hetero junction field effect transistors with variation in characteristics.

The present invention contemplates a hetero junction field effect transistor allowing a recessed gate to be formed with good repeatability and a method of fabricating such hetero junction field effect transistor.

The present invention is a hetero junction field effect transistor including: a first layer of a nitride based, group III-V compound semiconductor; a second layer of a nitride based, group III-V compound semiconductor containing a rare earth element, overlying the first layer; a pair of third layers of a nitride based, group III-V compound semiconductor, overlying the second layer, the third layers being spaced from each other; a gate electrode disposed between the third layers at least a region of the second layer; and a source electrode overlying one of the third layers and a drain electrode overlying an other of the third layers.

In the present hetero junction field effect transistor preferably the rare earth element is at least one selected from the group consisting of Cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu).

In the present hetero junction field effect transistor preferably the third layer is formed of an n type, nitride based, group III-V compound semiconductor.

In the present hetero junction field effect transistor preferably the second layer has a thickness of at most 5 nm.

Furthermore the present invention is a hetero junction field effect transistor including: a first layer of a nitride based, group III-V compound semiconductor; a second layer of a nitride of a rare earth element, overlying the first layer; a pair of third layers of a nitride based, group III-V compound semiconductor, overlying the second layer, the third layers being spaced from each other; a gate electrode disposed between the third layers at least a region of the second layer; and a source electrode overlying one of the third layers and a drain electrode overlying an other of the third layers.

In the present hetero junction field effect transistor preferably the rare earth element is at least one selected from the group consisting of Ce, Pr, Nd, Pm, Sm, Eu, Gd, Tb, Dy, Ho, Er, Tm, Yb and Lu.

In the present hetero junction field effect transistor preferably the third layer is formed of an n type, nitride based, group III-V compound semiconductor.

In the present hetero junction field effect transistor preferably the second layer has a thickness of at most 5 nm.

Furthermore the present invention is a method of fabricating a hetero junction field effect transistor, including the steps of: depositing on a first layer of a nitride based, group III-V compound semiconductor a second layer of one of a nitride based, group III-V compound semiconductor containing a rare earth element or a nitride of a rare earth element; depositing on the second layer a third layer of a nitride based, group III-V compound semiconductor; providing a source electrode and a drain electrode on the third layer; etching away a portion of the third layer in a plasma with a gas containing one of chlorine and fluorine to expose a portion of a surface of the second layer; and providing a gate electrode on at least a region of the surface of the second layer exposed.

The present invention can thus provide a hetero junction field effect transistor allowing a recessed gate to be formed with good repeatability and a method of fabricating such hetero junction field effect transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
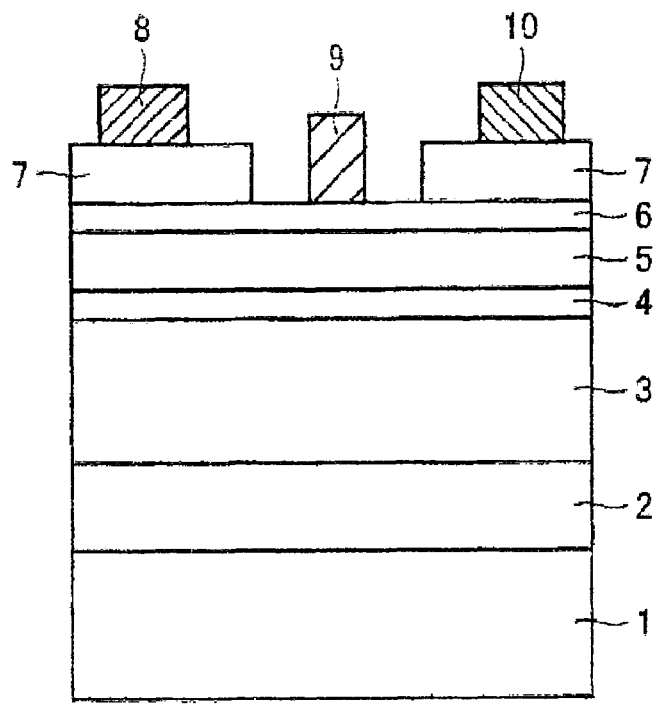
FIG. 1 is a schematic cross section of one preferred example of the present hetero junction field effect transistor.

Hereinafter embodiments of the present invention will be described. In the figures identical reference characters denote identical or corresponding portions.

First Embodiment

FIG. 1 is a schematic cross section of one preferred example of the present hetero junction field effect transistor. The FIG. 1 hetero junction field effect transistor has the structure including a multi buffer layer 2 having an AlN layer and a GaN layer alternately deposited in layers, a GaN layer 3 serving as a channel layer, an AlN layer 4 serving as a hetero characteristic improvement layer, an $Al_{0.3}Ga_{0.7}N$ layer 5 serving as a first layer, an $Al_{0.35}Ga_{0.6}Gd_{0.05}N$ layer 6 serving as a second layer, and an $Al_{0.3}Ga_{0.7}N$ layer 7 serving as a pair of third layers deposited on as Si substrate 1 in this order.

The pair of $Al_{0.3}Ga_{0.7}N$ layers 7 are spaced on $Al_{0.35}Ga_{0.6}Gd_{0.05}N$ layer 6. On one $Al_{0.3}Ga_{0.7}N$ layer 7 a source electrode 8 is disposed and on the other $Al_{0.3}Ga_{0.7}N$ layer 7 a drain electrode 10 is disposed. Furthermore a gate electrode 9 is disposed between $Al_{0.3}Ga_{0.7}N$ layers 7 at least a portion of the region of $Al_{0.35}Ga_{0.6}Gd_{0.05}N$ layer 6.

AlN layer 4 has a band gap larger than GaN layer 3. Accordingly, a two dimensional electron gas layer is provided at an interface of GaN layer 3 and AlN layer 4 at a portion closer to GaN layer 3 to serve as a channel region. Source electrode 8 feeds a carrier which passes through the two dimensional electron gas layer serving as a channel region and is extracted from drain electrode 10. Whether the carrier is moved through the channel region can be controlled by whether voltage is applied to gate electrode 9.

Figure 2:
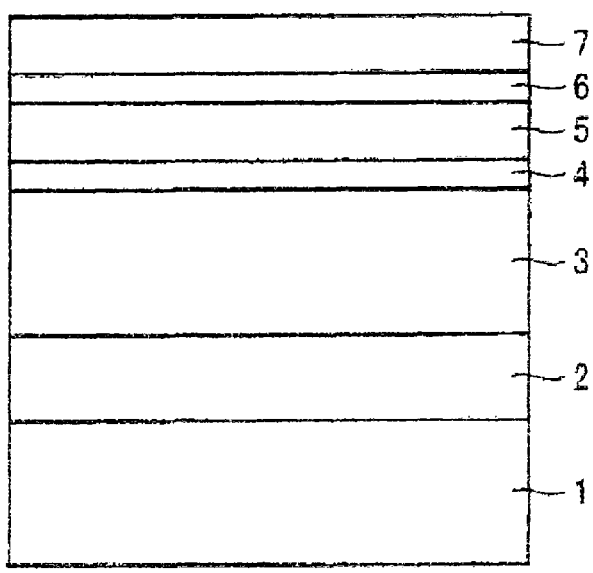
FIGS. 2-4 are schematic cross sections for illustrating one example of steps in fabricating the hetero junction field effect transistor of FIG. 1.

The FIG. 1 hetero junction field effect transistor can be fabricated for example as follows: Initially, as shown in the FIG. 2 showing a schematic cross section, on Si substrate 1, multi buffer layer 2, GaN layer 3 having a thickness for example of 2 μm, AlN layer 4 having a thickness for example of 1 nm, $Al_{0.3}Ga_{0.7}N$ layer 5 having a thickness for example of 10 nm, $Al_{0.35}Ga_{0.6}Gd_{0.05}N$ layer 6 having a thickness for example of 3 nm, and $Al_{0.3}Ga_{0.7}N$ layer 7 for example having a thickness of 20 nm and a carrier density of $5 \times 10^{18}$ cm$^{-3}$ are grown for example by MOCVD, MBE, or similar vapor phase deposition method. If $Al_{0.35}Ga_{0.6}Gd_{0.05}N$ layer 6 is grown for example by MOCVD, a Gd source implemented by $Cp^3Gd$ (cyclopenta Gd) can be used, and if the layer is grown for example by MBE, a Gd source implemented by a simple substance of metal of Gd can be used.

The substrate is not limited to Si substrate 1. It may be a sapphire substrate, an SiC substrate or a similar semiconductor substrate. Note that multi buffer layer 2 has a layered structure that can vary with the type of the substrate.

Furthermore GaN layer 3 serving as a channel layer preferably has a thickness of at least 1 μm. Furthermore the channel layer preferably has a carrier density reduced as much as possible. For example the layer preferably has a carrier density of at most $10^{15}$ cm$^{-1}$.

Furthermore, $Al_{0.3}Ga_{0.7}N$ layer 5 serving as the first layer is not limited to any particular composition or thickness. It should be noted, however, that the layer varies in thickness with composition to have a thickness required to provide a normally off transistor. For example for $Al_{0.3}Ga_{0.7}N$ layer 5 a thickness of at most 10 nm allows a transistor to be a normally off transistor.

Furthermore, the second layer is not limited to any particular composition or any particular number of constituent rare earth elements. Furthermore $Al_{0.3}Ga_{0.7}N$ layer 7 serving as the third layer is not limited to any particular thickness or any particular carrier density.

Figure 3:
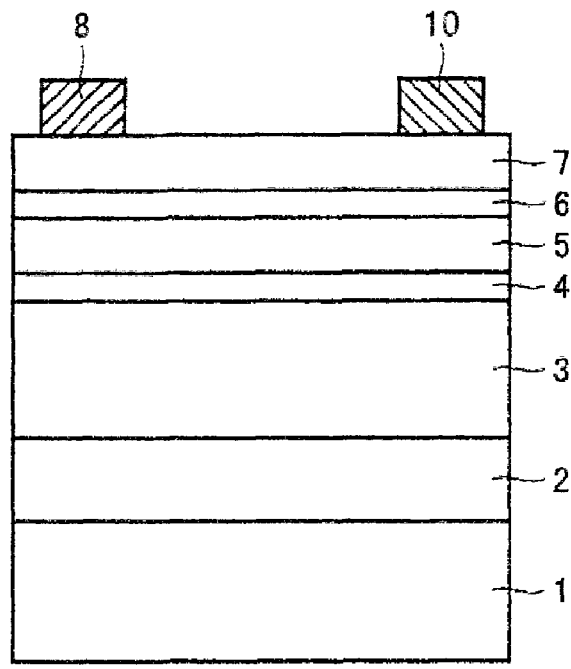

Photolithography is then employed to provide resist patterned in a predetermined form on a surface of $Al_{0.3}Ga_{0.7}N$ layer 7, and a film of metal is for example vapor-deposited thereon for the source and drain electrodes. The resist is then lifted off and thus removed and thereafter the film of metal remaining on the surface of $Al_{0.3}Ga_{0.7}N$ layer 7 undergoes a heat treatment. Thus, as shown in FIG. 3 showing a schematic cross section, source and drain electrodes 8 and 10 are provided on the surface of $Al_{0.3}Ga_{0.7}N$ layer 7, and source and drain electrodes 8 and 10 each have ohmic contact with $Al_{0.3}Ga_{0.7}N$ layer 7.

Note that source and drain electrodes 8 and 10 can be formed of a film of metal that is formed of a Ti layer and an Al layer deposited in this order, a film of metal that is formed of a Hf layer, an Al layer, a Hf layer, and an Au layer deposited in this order, or the like.

Figure 4:
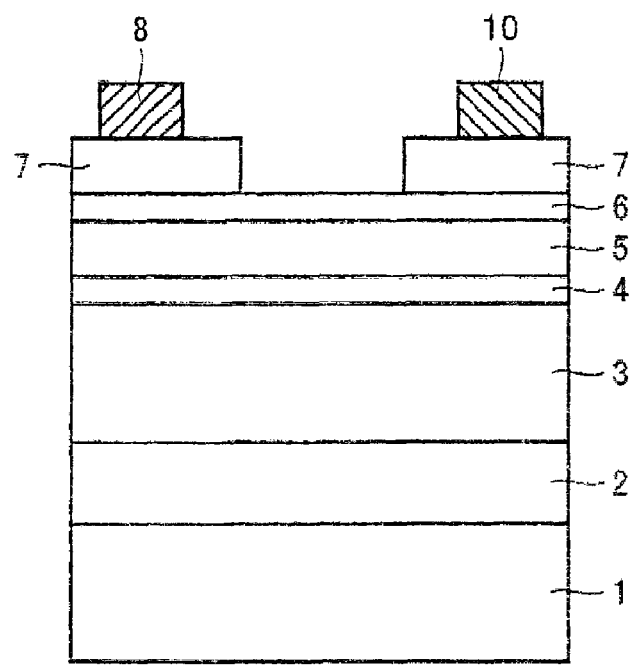

Subsequently $Al_{0.3}Ga_{0.7}N$ layer 7 is partially etched away in plasma to partially expose a surface of $Al_{0.35}Ga_{0.6}Gd_{0.05}N$ layer 6 to form a recessed gate, as shown in FIG. 4 showing a schematic cross section. $Al_{0.3}Ga_{0.7}N$ layer 7 can be etched in plasma for example in chlorine gas by an inductively coupled plasma (ICP) etcher.

On at least a portion of the exposed surface of $Al_{0.35}Ga_{0.6}Gd_{0.05}N$ layer 6 gate electrode 9 formed for example of WN is disposed to have schottky contact with $Al_{0.35}Ga_{0.6}Gd_{0.05}N$ layer 6. A wafer having provided with gate electrode 9 is divided into chips to provide the hetero junction field effect transistor shown in FIG. 1.

In the present embodiment $Al_{0.3}Ga_{0.7}N$ layer 5, $Al_{0.35}Ga_{0.6}Gd_{0.05}N$ layer 6 and $Al_{0.3}Ga_{0.7}N$ layer 7 provide a 3-layer barrier layer. The center, $Al_{0.35}Ga_{0.6}Gd_{0.05}N$ layer 6 is thus etched in plasma at a rate significantly smaller than $Al_{0.3}Ga_{0.7}N$ layer 7. If the layer is etched in plasma at a slightly varying rate or for a slightly increased period of time, the underlying, $Al_{0.3}Ga_{0.7}N$ layer 5 is not etched in plasma. This can leave $Al_{0.3}Ga_{0.7}N$ layer 5 well controlled to have a thickness required for normally off operation, and thus form a recessed gate with good repeatability.

The hetero junction field effect transistor thus fabricated can be a normally off hetero junction field effect transistor excellent in in-plane uniformity (i.e., the uniformity of the voltage (0V for normally off) being applied to the gate electrode of each hetero junction field effect transistor that is obtained from a single wafer when the transistor is pinched off) and run-to-run uniformity (i.e., the uniformity of the voltage (0V for normally off) being applied to the gate electrode of each of hetero junction field effect transistors that are obtained from different wafers identical in structure when the transistor is pinched off).

Note that $Al_{0.3}Ga_{0.7}N$ layer 7 can be etched in plasma for a period of time that can be determined as follows: A period of time allowing $Al_{0.3}Ga_{0.7}N$ layer 7 to be etched in plasma entirely in depth is previously calculated and for example the calculated period of time is then increased by a few tens percents, and for such a longer period of time than the previously calculated period of time the layer may be etched in plasma. For example, if a period of 30 seconds is required to etch $Al_{0.3}Ga_{0.7}N$ layer 7 having a thickness of 15 nm in plasma, the layer is etched in plasma for 36 seconds. As $Al_{0.35}Ga_{0.6}Gd_{0.05}N$ layer 6 acts as an etching stopper layer, the underlying, $Al_{0.3}Ga_{0.7}N$ layer 5 can remain to have a predetermined thickness uniformly.

Furthermore while in the above description the second layer is implemented by $Al_{0.35}Ga_{0.6}Gd_{0.05}N$ layer 6, the second layer is preferably implemented by a layer of material containing a nitride based, group III-V compound semiconductor represented by a formula of $Al_xGa_yIn_zN$ containing at least one type of rare earth element selected from the group consisting of Ce, Pr, Nd, Pm, Sm, Eu, Gd, Tb, Dy, Ho, Er, Tm, Yb and Lu, wherein $0 \leq x \leq 1$, $0 \leq y \leq 1$, $0 \leq z \leq 1$, and $x+y+z \neq 0$. A nitride of these rare earth elements provides semiconductor. Accordingly the second layer formed of a nitride based, group III-V compound semiconductor represented by the formula of $Al_xGa_yIn_zN$ containing at least one type of the rare earth elements can also be semiconductor, wherein $0 \leq x \leq 1$, $0 \leq y \leq 1$, $0 \leq z \leq 1$, and $x+y+z \neq 0$. Thus the second layer thus configured also does not impair the transistor in characteristic and also has a tendency to serve as an effective etching stopper layer.

Furthermore in the present invention preferably the second layer formed of the nitride based, group III-V compound semiconductor containing the rare earth element(s) has a thickness of at most 5 nm. If the second layer has a thickness exceeding 5 nm it would sufficiently serves as an etching stopper layer. However, this provides a tendency that a layer underlying a gate electrode has a thickness larger than required to provide a normally off transistor, and such transistor may not be provided.

Furthermore in the present invention preferably the third layer is formed of an n-type, nitride based, group III-V compound semiconductor. If the third layer is formed of the n-type, nitride based, group III-V compound semiconductor, there is a tendency that the ohmic contact with the source and drain electrodes disposed on the third layer can be reduced in resistance. This can contribute to reduced on-state resistance. Furthermore if the second layer has a band gap smaller than the third layer the third layer is preferably formed of n type, nitride based, group III-V compound semiconductor to supply sufficient electrons to supplement those trapped in the second layer.

Second Embodiment

Figure 5:
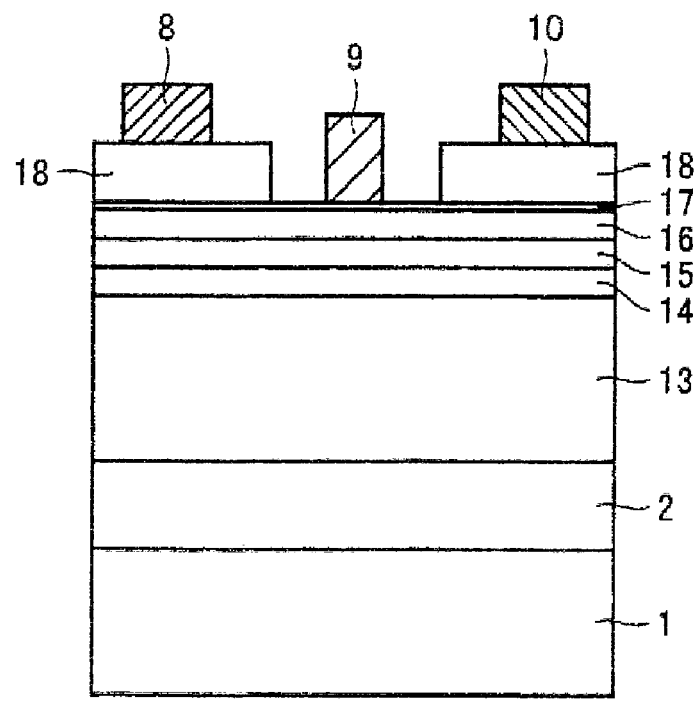
FIG. 5 is a schematic cross section of another preferred example of the present hetero junction field effect transistor.

FIG. 5 is a schematic cross section of one preferred example of the present hetero junction field effect transistor. The FIG. 5 hetero junction field effect transistor has the structure, multi buffer layer 2 having an AlN layer and a GaN layer alternately deposited in layers, an $Al_{0.05}Ga_{0.95}N$ layer 13 serving as a lower barrier layer, a GaN layer 14 serving as a channel layer, an AlN layer 15 serving as a hetero characteristic improvement layer, an $Al_{0.25}Ga_{0.7}In_{0.05}N$ layer 16 serving as a first layer, a DyN layer 17 formed of a nitride of Dy, which is a rare earth element, or dysprosium nitride (DyN), and serving as a second layer, and an $Al_{0.3}Ga_{0.65}In_{0.05}N$ layer 18 serving as a pair of third layers.

The pair of $Al_{0.3}Ga_{0.65}In_{0.05}N$ layers 18 are spaced on DyN layer 17. On one $Al_{0.3}Ga_{0.65}In_{0.05}N$ layer 18 source electrode 8 is disposed and on the other $Al_{0.3}Ga_{0.65}In_{0.05}N$ layer 18 drain electrode 10 is disposed. Furthermore gate electrode 9 is disposed between $Al_{0.3}Ga_{0.65}In_{0.05}N$ layers 18 at least a portion of the region of DyN layer 17.

$Al_{0.05}Ga_{0.95}N$ layer 13 has a band gap larger than GaN layer 14. Accordingly, a two dimensional electron gas layer is provided at an interface of $Al_{0.05}Ga_{0.95}N$ layer 13 and GaN layer 14 at a portion closer to GaN layer 14 to serve as a channel region. Source electrode 8 feeds a carrier which passes through the two dimensional electron gas layer serving as a channel region and is extracted from drain electrode 10. Whether the carrier is moved through the channel region can be controlled by whether voltage is applied to gate electrode 9.

Figure 6:
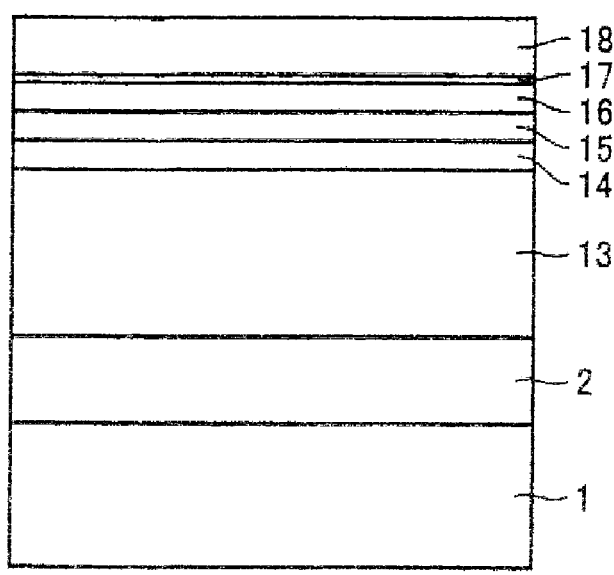
FIGS. 6-8 are schematic cross sections for illustrating one example of steps in fabricating the hetero junction field effect transistor of FIG. 5.

The hetero junction field effect transistor shown in FIG. 5 can be fabricated for example as follows: Initially, as shown in the FIG. 6 showing a schematic cross section, on Si substrate 1, multi buffer layer 2, $Al_{0.05}Ga_{0.95}N$ layer 13 having a thickness for example of 2 μm, GaN layer 14, AlN layer 15 having a thickness for example of 1 nm, $Al_{0.25}Ga_{0.7}In_{0.05}N$ layer 16 having a thickness for example of 10 nm, DyN layer 17 having a thickness for example of 2 nm, and $Al_{0.3}Ga_{0.65}In_{0.05}N$ layer 18 for example having a thickness of 25 nm and a carrier density of $5 \times 10^{18}$ cm$^{-3}$ are grown for example by MOCVD, MBE, or similar vapor phase deposition method. If DyN layer 17 is grown for example by MOCVD, a Dy source implemented by $Cp_3Dy$ (cyclopenta Dy) can be used, and if the layer is grown for example by MBE, a Dy source implemented by a simple substance of metal of Dy can be used.

The substrate is not limited to Si substrate 1. It may be a sapphire substrate, an SiC substrate or a similar semiconductor substrate. Note that multi buffer layer 2 has a layered structure that can vary with the type of the substrate.

Furthermore $Al_{0.05}Ga_{0.95}N$ layer 13 serving as a lower barrier layer preferably has a thickness of at least 1 μm. Furthermore the channel layer preferably has a carrier density reduced as much as possible. For example the layer preferably has a carrier density of at most $10^{15}$ cm$^{-3}$.

Furthermore, $Al_{0.25}Ga_{0.7}In_{0.05}N$ layer 16 serving as the first layer is not limited to any particular composition or thickness. It should be noted, however, that the layer varies in thickness with composition to have a thickness required to provide a normally off transistor. For example for $Al_{0.25}Ga_{0.7}In_{0.05}N$ layer 16 a thickness of at most 10 nm allows a transistor to be a normally off transistor.

Furthermore, the second layer is not limited to any particular composition or any particular number of constituent rare earth elements. The second layer may by other than the DyN layer. It may for example be a $Gd_{0.8}Dy_{0.2}N$ layer, a $Ce_{0.2}Pr_{0.6}Nd_{0.2}N$ layer, or the like.

Furthermore $Al_{0.3}Ga_{0.65}In_{0.05}N$ layer 18 serving as the third layer is not limited to any particular thickness or any particular carrier density.

Figure 7:
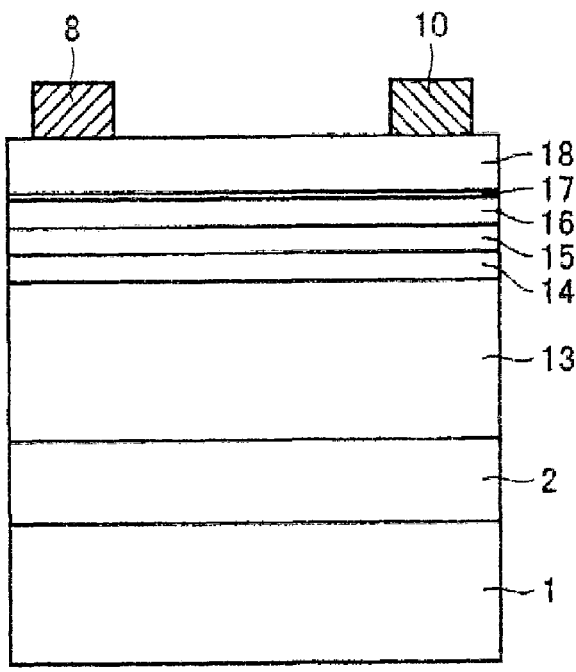

Photolithography is then employed to provide resist patterned in a predetermined form on a surface of $Al_{0.3}Ga_{0.65}In_{0.05}N$ layer 18, and a film of metal is for example vapor-deposited thereon for the source and drain electrodes. The resist is then lifted off and thus removed and thereafter the film of metal remaining on the surface of $Al_{0.3}Ga_{0.65}In_{0.05}N$ layer 18 undergoes a heat treatment. Thus, as shown in FIG. 7 showing a schematic cross section, source and drain electrodes 8 and 10 are provided on the surface of $Al_{0.3}Ga_{0.65}In_{0.05}N$ layer 18, and source and drain electrodes 8 and 10 each have ohmic contact with $Al_{0.3}Ga_{0.65}In_{0.05}N$ layer 18.

Note that source and drain electrodes 8 and 10 can be formed of a film of metal that is formed of a Ti layer and an Al layer deposited in this order, a film of metal that is formed of a Hf layer, an Al layer, a Hf layer, and an Au layer deposited in this order, or the like.

Figure 8:
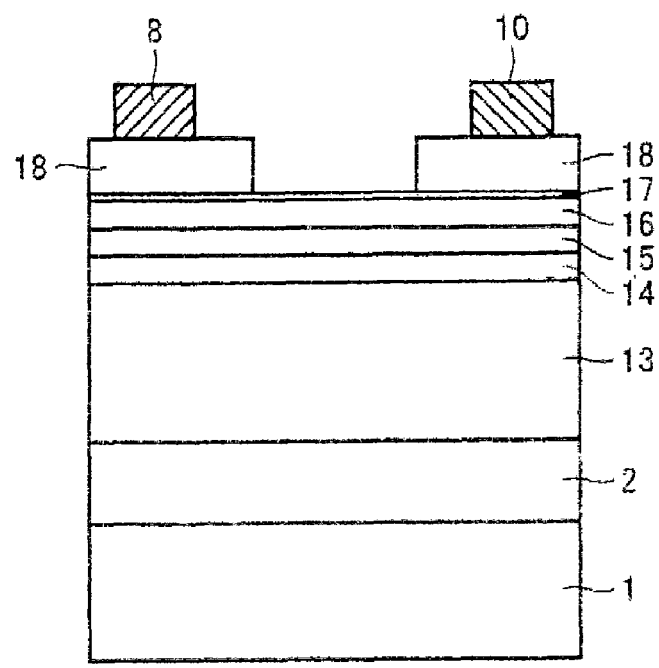

Subsequently $Al_{0.3}Ga_{0.65}In_{0.05}N$ layer 18 is partially etched away in plasma to partially expose a surface of DyN layer 17 to form a recessed gate, as shown in FIG. 8 showing a schematic cross section. $Al_{0.3}Ga_{0.65}In_{0.05}N$ layer 18 can be etched in plasma for example in chlorine gas by an inductively coupled plasma (ICP) etcher.

On at least a portion of the exposed surface of DyN layer 17 gate electrode 9 formed for example of WN is disposed to have schottky contact with DyN layer 17. A wafer having provided with gate electrode 9 is divided into chips to provide the hetero junction field effect transistor shown in FIG. 5.

In the present embodiment $Al_{0.25}Ga_{0.7}In_{0.05}N$ layer 16, DyN layer 17 and $Al_{0.3}Ga_{0.65}In_{0.05}N$ layer 18 provide a 3-layer barrier layer. The center, DyN layer 17 is thus etched in plasma at a rate significantly smaller than $Al_{0.3}Ga_{0.65}In_{0.05}N$ layer 18. If the layer is etched in plasma at a slightly varying rate or for a slightly increased period of time, the underlying, $Al_{0.25}Ga_{0.7}In_{0.05}N$ layer 16 is not etched in plasma. This can leave $Al_{0.25}Ga_{0.7}In_{0.05}N$ layer 16 well controlled to have a thickness required for normally off operation, and thus form a recessed gate with good repeatability.

The hetero junction field effect transistor thus fabricated can be a normally off hetero junction field effect transistor excellent in in-plane uniformity (i.e., the uniformity of the voltage (0V for normally off) being applied to the gate electrode of each hetero junction field effect transistor that is obtained from a single wafer when the transistor is pinched off) and run-to-run uniformity (i.e., the uniformity of the voltage (0V for normally off) being applied to the gate electrode of each of hetero junction field effect transistors that are obtained from different wafers identical in structure when the transistor is pinched off).

Note that $Al_{0.3}Ga_{0.65}In_{0.05}N$ layer 18 can be etched in plasma for a period of time that can be determined as follows: A period of time allowing $Al_{0.3}Ga_{0.65}In_{0.05}N$ layer 18 to be etched in plasma entirely in depth is previously calculated and for example the calculated period of time is then increased by a few tens percents, and for such a longer period of time than the previously calculated period of time the layer may be etched in plasma. For example, if a period of 60 seconds is required to etch $Al_{0.3}Ga_{0.65}In_{0.05}N$ layer 18 having a thickness of 25 nm in plasma, the layer is etched in plasma for 80 seconds. As DyN layer 17 acts as an etching stopper layer, the underlying, $Al_{0.25}Ga_{0.7}In_{0.05}N$ layer 16 can remain to have a predetermined thickness uniformly.

Furthermore in the above description the second layer is implemented by DyN layer 17, the second layer is preferably implemented by a layer of a nitride of at least one rare earth element selected from the group consisting of Ce, Pr, Nd, Pm, Sm, Eu, Gd, Tb, Dy, Ho, Er, Tm, Yb and Lu. A nitride of these rare earth elements provides semiconductor. Thus the second layer thus configured also does not impair the transistor in characteristic and also has a tendency to serve as an effective etching stopper layer.

Furthermore in the present invention preferably the second layer formed of the nitride of the rare earth element(s) has a thickness of at most 5 nm. If the second layer has a thickness exceeding 5 nm it would sufficiently serves as an etching stopper layer. However, this provides a tendency that a layer underlying a gate electrode has a thickness larger than required to provide a normally off transistor, and such transistor may not be provided.

Furthermore in the present invention preferably the third layer is formed of an n-type, nitride based, group III-V compound semiconductor. If the third layer is formed of the n-type, nitride based, group III-V compound semiconductor, there is a tendency that the ohmic contact with the source and drain electrodes disposed on the third layer can be reduced in resistance. This can contribute to reduced on-state resistance. Furthermore if the second layer has a band gap smaller than the third layer the third layer is preferably formed of n type, nitride based, group III-V compound semiconductor to supply sufficient electrons to supplement those trapped in the second layer.

Furthermore in the present invention the plasma etching is preferably done with a gas containing chlorine or fluorine, since a chloride of a rare earth element and a fluoride of a rare earth element is low in vapor pressure, and the plasma etching rapidly drops in rate, and accordingly the second layer formed of a nitride based, group III-V compound semiconductor containing a rare earth element or a nitride of a rare earth element has a tendency to serve as an effective etching stopper layer.

The present invention can thus provide a hetero junction field effect transistor allowing a recessed gate to be formed with good repeatability and a method of fabricating such hetero junction field effect transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A hetero junction field effect transistor, comprising:
   a channel layer of a nitride based, group III-V compound semiconductor;
   a hetero characteristic improvement layer of a nitride based, group III-V compound semiconductor overlying and physically contacting said channel layer;
   a first layer of a nitride based, group III-V compound semiconductor, overlying and physically contacting said hetero characteristic improvement layer;
   a second layer of a nitride of a rare earth element, overlying and physically contacting said first layer;
   a pair of third layers of a nitride based, group III-V compound semiconductor, overlying and physically contacting said second layer, said third layers being spaced from each other;
   a two dimensional electron gas layer provided between said channel layer and said hetero characteristic improvement layer;
   a gate electrode disposed between said third layers on at least a region of said second layer; and
   a source electrode overlying one of said third layers and a drain electrode overlying an other of said third layers.

2. The hetero junction field effect transistor according to claim 1, wherein said rare earth element is at least one selected from the group consisting of Ce, Pr, Nd, Pm, Sm, Eu, Gd, Tb, Dy, Ho, Er, Tm, Yb and Lu.

3. The hetero junction field effect transistor according to claim 1, wherein said third layer is formed of an n type, nitride based, group III-V compound semiconductor.

4. The hetero junction field effect transistor according to claim 1, wherein said second layer has a thickness of at most 5 nm.

* * * * *